US005527989A

United States Patent [19]

Leeb

[11] Patent Number: 5,527,989

[45] Date of Patent: Jun. 18, 1996

[54] FLEXIBLE DEVICE FOR ENCAPSULATING ELECTRONIC COMPONENTS

[75] Inventor: Karl-Erik Leeb, Lillebo, Sweden

[73] Assignee: Telefonaktiebolaget LM Ericsson, Stockholm, Sweden

[21] Appl. No.: 313,317

[22] PCT Filed: Feb. 11, 1993

[86] PCT No.: PCT/SE93/00107

§ 371 Date: Oct. 7, 1994

§ 102(e) Date: Oct. 7, 1994

[87] PCT Pub. No.: WO94/18815

PCT Pub. Date: Aug. 18, 1994

[51] Int. Cl.[6] .......... H05K 9/00

[52] U.S. Cl. .......... 174/35 GC; 361/818

[58] Field of Search .......... 174/35 R, 35 GC, 174/35 MS; 361/816, 818; 257/727

[56] References Cited

U.S. PATENT DOCUMENTS

| | | | |
|---|---|---|---|
| 2,856,449 | 10/1958 | Coler | 174/50.64 |
| 3,572,499 | 3/1971 | Mondano | 206/1 |
| 4,154,344 | 5/1979 | Yenni, Jr. et al. | 206/524.6 |
| 4,218,578 | 8/1980 | Olschewski et al. | 174/35 R |
| 4,455,448 | 6/1984 | Bertolina | 174/35 R |
| 4,542,076 | 9/1985 | Bednarz et al. | 428/624 |
| 4,567,317 | 1/1986 | Ehrlich et al. | 174/35 MS |
| 4,647,714 | 3/1987 | Goto | 174/36 |
| 4,686,141 | 8/1987 | Burns et al. | 428/344 |
| 4,863,789 | 9/1989 | Arai | 428/253 |
| 4,868,033 | 9/1989 | Nakano et al. | 428/201 |
| 4,915,222 | 4/1990 | Reidinger et al. | 206/328 |
| 5,066,937 | 11/1991 | Moran | 174/35 MS X |
| 5,136,119 | 8/1992 | Leyland | 174/35 R |
| 5,360,941 | 11/1994 | Roes | 174/35 R |
| 5,374,779 | 12/1994 | Konishi | 174/35 R |
| 5,401,901 | 3/1995 | Gerry et al. | 174/35 MS |

FOREIGN PATENT DOCUMENTS

| | | |
|---|---|---|
| 2186807 | 1/1974 | France . |
| 3631531 | 4/1987 | Germany . |
| 462944 | 9/1990 | Sweden . |
| 9102330 | 2/1993 | Sweden . |

*Primary Examiner*—Kristine L. Kincaid
*Assistant Examiner*—Christopher Horgan
*Attorney, Agent, or Firm*—Burns, Doane, Swecker & Mathis

[57] ABSTRACT

A device for flexibly encasing electronic circuitry, where an electronic circuit is enclosed in a casing which includes a laminate consisting of metal and plastic sheets such as to form a diffusion impervious and electrically conductive structure which prevents harmful substances from reaching the electronic circuit and also prevents inductive electromagnetic exchange. Electrical conductors pass through the joint region of the laminate.

6 Claims, 1 Drawing Sheet

FLEXIBLE DEVICE FOR ENCAPSULATING ELECTRONIC COMPONENTS

TECHNICAL FIELD

The present invention relates to a device for encapsulating electronic components or circuitry such as to protect the electric circuit against substances which may act deleteriously thereon, wherein the device also attenuates radiofrequency electromagnetic radiation so as to protect the circuit against such radiation that can enter from the surroundings and disturb the function of the circuit through induction, said device also being active to protect the surroundings when the circuit concerned constitutes a disturbance or interference source. The device includes throughlet conductors which allow circuit-functional current and signals to be applied when required.

TECHNICAL FIELD

It is often necessary to protect electronic circuits against different influences emanating from the surroundings. Factors which influence electronic circuitry include water and other corrosive and electrically conductive materia. It is also often important to protect the circuitry against electromagnetic radiation. In this regard, there is traditionally used different types of capsules which can be roughly divided into two main groups, hermetic capsules and plastic capsules. In the case of hermetic capsules, the electronic circuitry is surrounded by a clean and dry volume of gas enclosed in a diffusion-impervious casing, normally a metal, glass or ceramic casing. When the casing is made of metal, glass throughlets are fused in the metal casing for leading electrical conductors between the encapsulated circuitry and the ambient surroundings. When a plastic capsule is used, the circuitry is surrounded by plastic material instead of clean or pure gas. Although the plastic material is permeable to water and gases, it will nevertheless often provide satisfactory protection, because coherent films are unable to form on the surfaces of the circuit components. Furthermore, plastic material has a more or less pronounced ability to bind chemically with the polar groups present in the surface of the circuit components. These groups are thus blocked so as to be unable to form corrosion attack sites. The differences in the coefficient of thermal expansion between the different materials present constitutes a problem in both types of capsule. Another problem is that the circuitry is often so sensitive as to react against compounds which are split or cleaved from the actual encapsulating materials. A third problem is that polymeric material is often unable to withstand the working temperatures concerned, particularly as rises in temperature are often local, spotwise temperature increases, wherewith the plastic encapsulating materials connect directly on to these points. This can result in degradation of properties and spalling of the corrosive substances. In the case of plastic capsules, it is often difficult to conduct heat away from the electronic circuitry to the surroundings and they have no electrically shielding ability. In addition to these technical problems, there is often a low price interest.

The levels of these various requirements vary, although they are particularly stringent in the case of electronic circuitry for use in cars and radio communication systems for instance. Several attempts have been made to glue hermetic metal and ceramic capsules, although it has been found difficult to obtain glue joints which are age-resistant and impervious. For the purpose of packaging electronic circuitry which is sensitive to electric discharge caused by static electricity, encapsulating bags have been developed which include a casing comprised of plastic sheets on which thin metal layers have been applied by vapour deposition. These principles cannot be applied, however, in advanced encapsulation, since the metal layers obtained by vapour deposition or sputtering do not have a thickness which renders the encapsulation impervious to diffusion. Furthermore, with regard to radio frequency radiation, the depth of current penetration is many times greater than the depth of penetration in the case of a metal layer and consequently the resistivity in the casing is too high to attenuate such radiation effectively and therewith provide an efficient shielding effect.

DISCLOSURE OF THE INVENTION

The object of the present invention is to avoid those problems which exist with present-day electronic circuitry encapsulating devices. In accordance with the invention, there is provided to this end a device in which the electronic circuitry is encased, either completely or partially, in a casing which is comprised of a plastic and metal-sheet laminate. The metal sheet, or sheets, has/have a thickness at which it/they is/are diffusion-impervious and electrically shielding, with regard to the necessary electrical conductivity and at the then prevailing penetration depths of the electric currents at the frequency concerned, or corresponding rise times in the case of digital transmission. The device may include a laminate which comprises several metal sheets and intermediate plastic sheets, therewith providing extremely effective diffusion-impervious and shielding properties, while obtaining a casing which is highly flexible and pliable, and enabling the casing to be readily given a bag-like configuration. The casing is closed and sealed with the aid of an adhesive, by thermal welding techniques, or by means of mechanical clamps. Electrical conductors are laminated in one section of the casing sealing location in a manner to obtain an impervious join between the electric conductors and the laminate. The bag is thus imperviously sealed by means of joints and electric signals and electric current can be passed to the electronic circuitry through the electrical conductors. The casing joints and the joints between the casing and the electric conductors are constructed so that the diffusion path between the plastic-metal laminate is so long, compared with the area in the plastic material which is perpendicular to the diffusion direction, as to enable the amount of contaminants, for instance water, that can diffuse into the bag during the lifetime of the electronic circuitry to be ignored in relation to the volume of gas enclosed.

One advantage afforded by the invention is that the device provides a practically diffusion-impervious and electrically-shielded, inexpensive encapsulation. Manufacturing costs are very low. Those parts of the electronic circuitry which develop heat can be cooled by bringing these parts into abutment with a large surface area on the inner surface of the casing and by applying cooling means to a corresponding surface area on the outer surface of the casing, so as to carry away or transfer the heat generated. The metal sheets in the casing can be connected directly to the electrical earth surfaces of the circuitry, so as to conduct away the induced currents in an electrically shielding function. The composition of the gas enclosed together with the circuitry can be checked in conjunction with sealing the casing, and the gas volume can be analyzed at any desired time, for instance with the aid of a masspectrometer, with the intention of checking the concentration of contaminants in the casing, for instance water. A gas sample can be taken through a very small opening in the casing, which is then preferably resealed, for instance in the same way as the remaining casing joints were achieved. When required, other devices may be incorporated in the casing for carrying light or heat, for instance.

BEST MODE OF CARRYING OUT THE INVENTION

Figure 1:
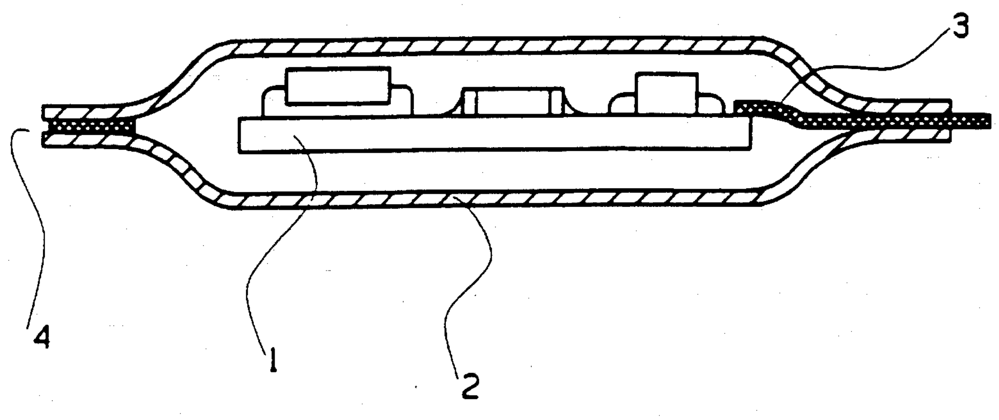
FIG. 1 is a sectional view of a flexible device for encapsulating electronic circuitry in accordance with the present invention.

FIG. 1 illustrates a typical device for flexibly encapsulating electronic circuitry. The device includes an electronic circuit board 1 which is fully enclosed by a bag 2. The bag 2 is sealed, for instance, by fusion-welded joints in the joint region 4. Electrical connections are achieved with the aid of electrical conductors 3 sealingly embraced in a part of the joint region 4.

Figure 2:
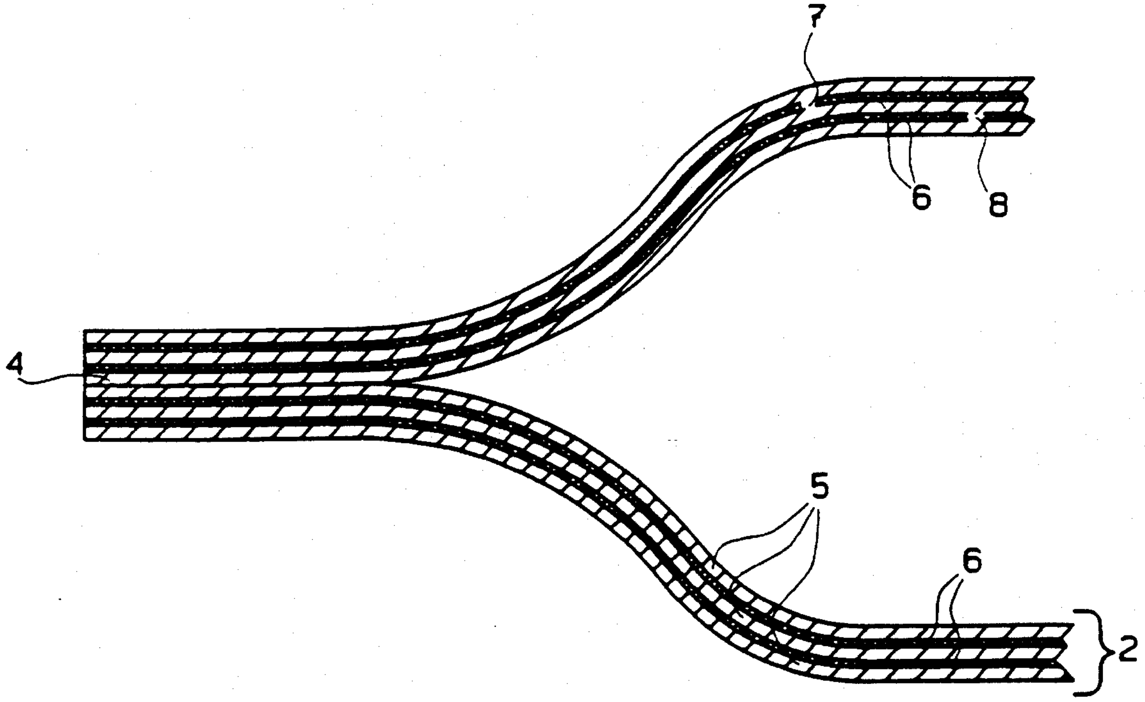
FIG. 2 is an enlarged, sectional view of one corner of the inventive encapsulating bag.

FIG. 2 illustrates part of the device in larger scale. The bag is comprised of a laminate structure 2 consisting of metal sheets laminated between plastic sheets 5 in a manner such that the plastic sheets 5 adhere sealingly to the whole of the surfaces of the metal sheets 6. The laminate structure 2 from which the bag is made is closed sealingly in the joint regions 4. The metal sheets 6 form a diffusion barrier against low molecular substances that are liable to damage the electronic circuit board. It is highly improbable that any damaged areas and pores 7, 8 in the metal sheets 6 will lie close together in the laminate structure 2. When seen in relation to the area extending perpendicularly to the diffusion direction, the diffusion paths of the penetrating contaminants in the laminate structure 2 and the joint region 4 are very long, and also in those points in the laminate structure 2 where defects in the form of pores 7, 8 in the metal sheets 6 are located. As will be understood, the length of the diffusion paths in relation to the area at right angles to the diffusion direction and also the thickness of the laminate structure 2 have been greatly exaggerated in the Figure, for the sake of illustration. In the illustrated embodiment, the laminate 2 is comprised of the following sheets, as seen from the outer surface of the casing: Polyethylene terephthalate 0.023 mm, aluminium 0.014 mm, polyethylene terephthalate 0.023 mm and, furthest in, low-pressure polyethylene 0.075 mm. The casing joints are formed by fusing the low-pressure polyethylene sheets together at a temperature of 150° C. and a pressure of $100N/cm^2$.

According to another embodiment, certain parts of the casing are advantageously joined to metal parts, for instance to carry away heat, or to a glass window through which a display on the electronic board can be seen. According to a further variant of the inventive device, a joint is advantageously formed between the electronic circuit card and the casing. In those instances where joints are desired with other materials than the actual laminate 2, for instance with metal, glass or with circuit board surfaces, that side of the laminate 2 which is to be heat-welded to these materials is comprised of polyethylene which has been modified with carboxyl groups which have been cross-linked with zinc ions, so-called ionomer plastic. Such plastics have the ability to form bonds with many different types of surfaces, so as to obtain a joint of satisfactory mechanical strength. In these cases, the fusion welding process can be effected at 130° C. and at $100N/cm^2$.

It will be understood that other variants are conceivable, these further variants being limited solely by the scope of the following Claims.

I claim:

1. A device for flexibly encasing an electronic circuit to prevent the electronic circuit from coming into contact with harmful substances present in the ambient environment, and for preventing undesirable exchange with induced electromagnetic fields, comprising an impervious casing comprising a metal and plastic laminate, and wherein the metal has a thickness which renders the laminate impervious to diffusion and capable of attenuating electromagnetic, radiofrequency radiation, and wherein the laminate has integrated therein electric conductors in the form of conductive paths printed in the metal and which can be electrically connected to the electronic circuit.

2. A device according to claim 1, wherein the laminate and the electric conductors are each connected to a respective joint region by fusion welding.

3. A device according to claim 1, wherein the laminate and the electric conductors are glued to their respective joint regions.

4. A device according to claim 1, wherein the laminate and the electric conductors are mechanically clamped to their respective joint regions.

5. A device according to claim 1, wherein a part of the casing is joined to a material other than the laminate.

6. A device according to claim 1, wherein a part of the casing is joined to the electronic circuit.

* * * * *